(12) United States Patent
Jin et al.

(10) Patent No.: US 11,450,534 B2
(45) Date of Patent: Sep. 20, 2022

(54) PACKAGING PROCESS FOR SIDE-WALL PLATING WITH A CONDUCTIVE FILM

(71) Applicant: VISHAY GENERAL SEMICONDUCTOR, LLC, Malvern, PA (US)

(72) Inventors: Longnan Jin, Tianjin (CN); Heinrich Karrer, Regau (AT); Junfeng Liu, Tianjin (CN); Huiying Ding, Tianjin (CN); Thomas Schmidt, Leonding (AT)

(73) Assignee: VISHAY GENERAL SEMICONDUCTOR, LLC, Malvern, PA (US)

( * ) Notice: Subject to any disclaimer, the term of this patent is extended or adjusted under 35 U.S.C. 154(b) by 0 days.

(21) Appl. No.: 17/059,074

(22) PCT Filed: Feb. 7, 2020

(86) PCT No.: PCT/US2020/017131
§ 371 (c)(1),
(2) Date: Nov. 25, 2020

(87) PCT Pub. No.: WO2021/133419
PCT Pub. Date: Jul. 1, 2021

(65) Prior Publication Data
US 2021/0366729 A1 Nov. 25, 2021

(30) Foreign Application Priority Data
Dec. 24, 2019 (CN) .......................... 201911347346.8

(51) Int. Cl.
*H01L 21/48* (2006.01)
*H01L 21/56* (2006.01)
(Continued)

(52) U.S. Cl.
CPC ........ *H01L 21/4842* (2013.01); *H01L 21/561* (2013.01); *H01L 21/78* (2013.01);
(Continued)

(58) Field of Classification Search
CPC ... H01L 21/4842; H01L 21/561; H01L 21/78; H01L 23/3107; H01L 23/49805;
(Continued)

(56) References Cited

U.S. PATENT DOCUMENTS

| 5,801,432 A | 9/1998 | Rostoker et al. |
| 5,976,912 A | 11/1999 | Fukutomi et al. |

(Continued)

FOREIGN PATENT DOCUMENTS

| EP | 1966743 B1 | 2/2011 |
| EP | 1958133 B1 | 3/2011 |

(Continued)

OTHER PUBLICATIONS

Rogren, Philip E. et al. "A High Performance and Cost Effective Molded Array Package Substrate." (2010).
(Continued)

*Primary Examiner* — Vu A Vu
(74) *Attorney, Agent, or Firm* — Volpe Koenig

(57) ABSTRACT

Techniques and devices are disclosed for forming wettable flanks on no-leads semiconductor packages. A lead frame assembly may include a plurality of leads, each lead including a die surface and a plating surface, and an integrated circuit die arranged on the die surface. The plating surface for each of the leads may be plated with an electrical plating. A connecting film may be applied and lead frame assembly may be singulated into individual semiconductor packages by a series of cuts through each of the plurality of leads and the electrical plating of each of the plurality of leads to a depth up to or through a portion of the connecting film to
(Continued)

create a channel exposing lead sidewalls of each of the plurality of leads. The lead sidewalls of each of the plurality of leads may be plated with a second electrical plating and the connecting film may be removed.

20 Claims, 9 Drawing Sheets

(51) Int. Cl.
*H01L 21/78* (2006.01)
*H01L 23/31* (2006.01)
*H01L 23/498* (2006.01)
*H01L 23/00* (2006.01)

(52) U.S. Cl.
CPC .... *H01L 23/3107* (2013.01); *H01L 23/49805* (2013.01); *H01L 24/48* (2013.01); *H01L 21/4839* (2013.01); *H01L 2224/48245* (2013.01)

(58) Field of Classification Search
CPC ............... H01L 24/48; H01L 21/4839; H01L 2224/48245; H01L 23/49548; H01L 23/49562; H01L 23/544; H01L 2221/68331; H01L 2223/54486; H01L 21/6835; H01L 23/49582; H01L 23/3121
USPC ........................................................ 257/676
See application file for complete search history.

(56) References Cited

U.S. PATENT DOCUMENTS

| | | | |
|---|---|---|---|
| 6,001,671 A | 12/1999 | Fjelstad | |
| 6,219,908 B1 | 4/2001 | Farnworth et al. | |
| 6,238,952 B1 | 5/2001 | Lin | |
| 6,400,004 B1 | 6/2002 | Fan et al. | |
| 6,498,099 B1 | 12/2002 | McLellan et al. | |
| 6,608,366 B1 | 8/2003 | Fogelson et al. | |
| 6,774,659 B1 | 8/2004 | Chiang | |
| 6,872,599 B1 | 3/2005 | Li et al. | |
| 6,888,231 B2 | 5/2005 | Maeda | |
| 6,987,034 B1 | 1/2006 | Chiang | |
| 7,119,421 B2 | 10/2006 | Rohrmoser et al. | |
| 7,183,630 B1 | 2/2007 | Fogelson et al. | |
| 7,645,635 B2 | 1/2010 | Wood et al. | |
| 7,816,186 B2 | 10/2010 | San Antonio et al. | |
| 7,943,431 B2 | 5/2011 | San Antonio et al. | |
| 8,017,447 B1 | 9/2011 | Olsen | |
| 8,071,427 B2 | 12/2011 | Celaya et al. | |
| 8,076,181 B1 | 12/2011 | Pruitt et al. | |
| 8,093,097 B2 | 1/2012 | Lange et al. | |
| 8,159,826 B2 | 4/2012 | Dijkstra et al. | |
| 8,329,509 B2 | 12/2012 | Gong et al. | |
| 8,395,399 B2 | 3/2013 | Rousseville et al. | |
| 8,436,460 B1 | 5/2013 | Gamboa et al. | |
| 8,437,141 B2 | 5/2013 | Rogy et al. | |
| 8,535,982 B1 | 9/2013 | Abdo et al. | |
| 8,541,786 B2 | 9/2013 | Boomen et al. | |
| 8,642,461 B2 | 2/2014 | Huening | |
| 8,685,795 B2 | 4/2014 | Wang | |
| 8,728,929 B2 | 5/2014 | Van Kempen et al. | |
| 8,809,121 B2 | 8/2014 | Li et al. | |
| 8,968,510 B2 | 3/2015 | Rogy et al. | |
| 9,006,034 B1 | 4/2015 | Sirinorakul | |
| 9,018,537 B2 | 4/2015 | Karrer | |
| 9,070,669 B2 | 6/2015 | Daniels et al. | |
| 9,099,486 B2 | 8/2015 | Merz et al. | |
| 9,153,529 B2 | 10/2015 | Van Kempen et al. | |
| 9,206,794 B2 | 12/2015 | Gridelet | |
| 9,281,284 B2 | 3/2016 | Yap et al. | |
| 9,287,200 B2 | 3/2016 | Higgins, III | |
| 9,324,637 B1 | 4/2016 | Bai et al. | |
| 9,379,071 B2 | 6/2016 | Kamphuis et al. | |
| 9,391,007 B1 | 7/2016 | Yeung et al. | |
| 9,418,919 B2 | 8/2016 | Groenhuis et al. | |
| 9,425,130 B2 | 8/2016 | Leung et al. | |
| 9,443,791 B2 | 9/2016 | Leung et al. | |
| 9,461,009 B1 | 10/2016 | Higgins, III et al. | |
| 9,466,585 B1 | 10/2016 | Kamphuis et al. | |
| 9,472,528 B2 | 10/2016 | Yap | |
| 9,538,659 B2 | 1/2017 | Viswanathan et al. | |
| 9,606,079 B2 | 3/2017 | Merz | |
| 9,607,918 B2 | 3/2017 | Gong et al. | |
| 9,640,463 B2 | 5/2017 | Lam et al. | |
| 9,673,150 B2 | 6/2017 | Gong et al. | |
| 9,741,692 B2 | 8/2017 | Karhade et al. | |
| 9,779,349 B2 | 10/2017 | Rogy et al. | |
| 9,847,283 B1 | 12/2017 | Ke et al. | |
| 9,935,079 B1 | 4/2018 | Foong et al. | |
| 9,966,326 B2 | 5/2018 | Mustanir et al. | |
| 9,974,174 B1 | 5/2018 | Wenzel et al. | |
| 10,079,198 B1 | 9/2018 | Cadag et al. | |
| 10,083,866 B2 | 9/2018 | Bin Mohd Arshad et al. | |
| 10,410,941 B2 | 9/2019 | Leung et al. | |
| 2002/0063315 A1 | 5/2002 | Huang et al. | |
| 2003/0006055 A1 | 1/2003 | Chien-Hung et al. | |
| 2004/0046240 A1 | 3/2004 | Hasebe et al. | |
| 2005/0116321 A1 | 6/2005 | Li et al. | |
| 2005/0218499 A1 | 10/2005 | Chang | |
| 2007/0126092 A1 | 6/2007 | San Antonio et al. | |
| 2008/0206588 A1 | 8/2008 | Lange et al. | |
| 2008/0230926 A1 | 9/2008 | Dijkstra et al. | |
| 2008/0258273 A1* | 10/2008 | Liang .................. H01L 23/3107 257/666 |
| 2008/0268578 A1 | 10/2008 | Shimanuki et al. | |
| 2008/0308310 A1 | 12/2008 | Rogy et al. | |
| 2008/0309462 A1 | 12/2008 | Rogy et al. | |
| 2010/0187663 A1 | 7/2010 | Celaya et al. | |
| 2010/0253372 A1 | 10/2010 | Rousseville et al. | |
| 2011/0033315 A1 | 2/2011 | Gridelet | |
| 2011/0147925 A1 | 6/2011 | Van Kempen et al. | |
| 2011/0244629 A1 | 10/2011 | Gong et al. | |
| 2011/0309514 A1 | 12/2011 | Boomen et al. | |
| 2012/0181678 A1 | 7/2012 | Groenhuis et al. | |
| 2013/0292553 A1 | 11/2013 | Chang et al. | |
| 2013/0334619 A1 | 12/2013 | Merz et al. | |
| 2013/0334695 A1 | 12/2013 | Tijssen et al. | |
| 2013/0341734 A1 | 12/2013 | Merz | |
| 2014/0167238 A1 | 6/2014 | Jeon et al. | |
| 2014/0357022 A1 | 12/2014 | Stacey | |
| 2015/0303156 A1 | 10/2015 | Kamphuis et al. | |
| 2016/0005679 A1 | 1/2016 | Israel et al. | |
| 2016/0035651 A1 | 2/2016 | Leung et al. | |
| 2016/0181122 A1 | 6/2016 | Eugene Lee et al. | |
| 2016/0218008 A1 | 7/2016 | Li et al. | |
| 2016/0276251 A1 | 9/2016 | Mustanir et al. | |
| 2016/0372403 A1 | 12/2016 | Lam et al. | |
| 2017/0005030 A1 | 1/2017 | Kitnarong et al. | |
| 2017/0107628 A1* | 4/2017 | Trinidad .................. C23C 18/54 |
| 2017/0338170 A1 | 11/2017 | Ziglioli | |
| 2017/0358514 A1 | 12/2017 | Yeung et al. | |
| 2017/0372988 A1 | 12/2017 | Groenhuis et al. | |
| 2018/0033647 A1 | 2/2018 | Bin Mohd Arshad et al. | |
| 2018/0068920 A1 | 3/2018 | Leung et al. | |
| 2018/0102287 A1 | 4/2018 | Santos et al. | |
| 2018/0358286 A1 | 12/2018 | Cadag et al. | |

FOREIGN PATENT DOCUMENTS

| | | | |
|---|---|---|---|
| EP | 2337068 A1 | 6/2011 | |
| EP | 2361000 A1 | 8/2011 | |
| EP | 2400534 A1 | 12/2011 | |
| EP | 2677540 A1 | 12/2013 | |
| EP | 2693465 A1 | 2/2014 | |
| EP | 2677307 B1 | 5/2016 | |
| EP | 3051592 A1 | 8/2016 | |
| EP | 2677306 B1 | 11/2017 | |
| EP | 3261115 A1 | 12/2017 | |
| EP | 3293760 A1 | 3/2018 | |
| EP | 3306660 A2 | 4/2018 | |
| EP | 3319122 B1 | 6/2019 | |
| EP | 2704192 B1 | 7/2019 | |

(56) References Cited

FOREIGN PATENT DOCUMENTS

| WO | 2006/134534 A1 | 12/2006 |
| --- | --- | --- |
| WO | 2007/052234 A2 | 5/2007 |
| WO | 2007/060631 A1 | 5/2007 |
| WO | 2009/072052 A1 | 6/2009 |
| WO | 2009/133499 A2 | 11/2009 |
| WO | 2009/144672 A1 | 12/2009 |
| WO | 2010/032192 A1 | 3/2010 |
| WO | 2020/185192 A1 | 9/2020 |
| WO | 2020/185193 A1 | 9/2020 |

OTHER PUBLICATIONS

Koschmieder et al., "Soldering the QFN Stacked Die Sensors to a PC Board," Freescale Semiconductor Application Note, AN3111, Rev. 5 (Apr. 2010).
NXP Semiconductors, "Surface Mount Reflow Soldering," Application Note, Rev. 6, AN10365 (Jul. 30, 2012).
Chip Scale Review, The Future of Semiconductor Packaging, vol. 18, No. 6, (Nov.-Dec. 2014).
Janóczki et al., "Automatic Optical Inspection of Soldering," (2013).
Amkor MicroLeadFrame® Data Sheet, DS572S (2017).
Cision PRWeb, "NXP Introduces LIN Transceiver for Smaller, Lighter and More Cost-Efficient ECU Designs," (Feb. 23, 2012).
NXP Semiconductors, TJA1027: LIN 2.2A/SAE J2602 transceiver, Product data sheet, Rev. 2 (Apr. 24, 2013).
International Search Report and Written Opinion dated Apr. 30, 2020 for PCT International Application No. PCT/US2020/017131.
J. Ganjei, "Improved QFN Reliability by flank tin plating process after singulation," 2015 10th International Microsystems, Packaging, Assembly and Circuits Technology Conference (IMPACT), 2015, pp. 137-140.
Extended European Search Report issued in counterpart EP Application No. 20848928.6 dated Mar. 28, 2022.
Search Report issued in European Patent Application No. 20848929.4 dated Jun. 1, 2022, consisting of 9 pp.

\* cited by examiner

PACKAGING PROCESS FOR SIDE-WALL PLATING WITH A CONDUCTIVE FILM

CROSS REFERENCE TO RELATED APPLICATIONS

This application is a 371 U.S. National Phase of International Application No. PCT/US2020/017131, filed on Feb. 7, 2020, which claims priority to Chinese Patent Application No. 201911347346.8, filed Dec. 24, 2019, which are incorporated by reference as if fully set forth.

BACKGROUND

Flat "no-leads' or "leadless" semiconductor die packages electrically and physically couple integrated circuit dies (or "dice") to printed circuit boards ("PCB") with flat leads and without through holes extending through a printed circuit board (PCB). Although these semiconductor die packages are referred to as "no-leads" or "leadless" packages, the term "leads" in the present disclosure is used to refer to the flat contact pads present on flat no-leads packages. These semiconductor die packages have no "leads" in the sense that there are no leads that extend past or beyond the outer periphery of the package. Flat no-leads packages may be classified as quad flat no-leads ("QFN") packages, having leads on all four sides of the package, and dual flat no-leads ("DFN") packages, having leads on two opposing sides. Within these semiconductor die packages, one or more integrated circuit dies is encapsulated within a non-conductive molding material. An electrically conductive lead frame, typically made of a metal like copper, is electrically coupled to internal components of the semiconductor die package and exposes leads externally that can be electrically coupled to a PCB. Improvements to flat no-leads packages are constantly being made.

Leadless semiconductor die packages have several advantages over packages having leads extending beyond a perimeter of the package. Such semiconductor die packages may have a low profile as compared to other types of semiconductor die packages. Such semiconductor die packages may take up less space and thereby have a smaller "footprint" on a printed circuit board than conventional packages having leads extending beyond the perimeter of the semiconductor die packages. Such leadless semiconductor die packages may also have better thermal performance as compared to packages having leads extending beyond the perimeter of the package.

An issue within the relevant industry as it concerns QFN and DFN packages relates to the inspection of the solder connections to the leads of the packages. In order to ensure proper solder connections to QFN and DFN packages, it is necessary to inspect the connections. These inspections can be performed by x-ray, for example, or by automated optical inspection (AOI). Automated optical inspection (AOI) systems are used to inspect, for example, semiconductor devices and printed circuit boards (PCBs), for defects. QFN and DFN packages can allow for AOI, which is less costly than x-ray inspections, if the leads are oriented in such a manner that the portions of the sides or "flanks" of the leads are wettable by solder, such as by having solder wick up the sides or sidewalls of the exposed leads.

Conventional lead wettable devices may be formed by a step cutting process which requires multiple surfaces to be plated at the same time with the same palatable material. Plating multiple surfaces at the same time may be complicated and may not allow targeted plating for specific surfaces.

There is therefore the need for an efficient method of manufacturing a semiconductor die packages having wettable flanks.

SUMMARY

In an aspect of the present invention, a method for fabricating a semiconductor die package from a package assembly includes a lead frame including at least a first lead and a second lead, the first and second leads each having a top surface and a bottom surface, a first integrated circuit die provided on the top surface of the first lead, a second integrated circuit die provided on the top surface of the second lead, and a mold encapsulation surrounding at least portions of the lead frame and at least portions of the first integrated circuit die and the second integrated circuit die, the mold encapsulation having a top major surface and a bottom major surface. The bottom surface of the first and second leads may be plated with a first electrical plating. A connecting film may be applied to the top surface of the mold encapsulation. A cut may be made through the first electrical plating on the bottom surface of the second lead through the top major surface of the mold encapsulation to create a channel, the channel exposing a first lead sidewall and a second lead sidewall of the second lead. A conductive film may be applied to connect the bottom surface of the first lead and the bottom surface of the second lead. The connecting film may be removed. The first lead sidewall and the second lead sidewall may be plated, through the channel, with a second electrical plating and the conductive film may be removed.

In an aspect of the present invention, a method for fabricating a semiconductor die package from a package assembly includes a lead frame including at least a first lead and a second lead, the first and second leads each having a top surface and a bottom surface, a first integrated circuit die provided on the top surface of the first lead, a second integrated circuit die provided on the top surface of the second lead, and a mold encapsulation surrounding at least portions of the lead frame and at least portions of the first integrated circuit die and the second integrated circuit die, the mold encapsulation having a top major surface and a bottom major surface. A bottom surface of the first lead and a bottom surface of the second lead may be plated with a first electrical plating. A conductive film may be applied to connect the bottom surface of the first lead and the bottom surface of the second lead. A cut may be made to create a channel through the mold encapsulation, the second lead, and the first electrical plating on the bottom surface of the second lead, the channel exposing a first lead sidewall and a second lead sidewall of the second lead. The first lead sidewall and the second lead sidewall may be platted, through the channel, with a second electrical plating and the conductive film may be removed.

In an aspect of the present invention, a method for fabricating a lead side-wall wettable semiconductor die package from a lead frame assembly includes a plurality of leads, each lead including a die surface and a plating surface, and an integrated circuit die arranged on the die surface. The lead frame assembly may be partially embedded in a mold encapsulation, the mold encapsulation having opposed first and second major surfaces. The plating surface of each of the plurality of leads may be plated with a first electrical plating. A connecting film may be applied to the first major surface of the mold encapsulation. The lead frame assembly may be singulated into individual semiconductor die packages. The singulating may include making a first series of parallel cuts along a first direction cutting through the second major surface of the mold encapsulation to a depth up to the connecting film or a portion of the connecting film and making a second series of parallel cuts along a second direction, the second direction substantially perpendicular to the first direction, the second series of parallel cuts cutting through the second major surface of the mold encapsulation, each of the plurality of leads, and the electrical plating of each of the plurality of leads to a depth up to the connecting film or a portion of the connecting film to create a channel exposing a first lead sidewall and a second lead sidewall of each of the plurality of leads. The first lead sidewall and the second lead sidewall of each of the plurality of leads may be plated, through the channels, with a second electrical plating. The connecting film may be removed to separate the individual lead side-wall wettable semiconductor die packages.

BRIEF DESCRIPTION OF THE DRAWINGS

A more detailed understanding can be had from the following description, given by way of example in conjunction with the accompanying drawings wherein.

DETAILED DESCRIPTION

Figure 1:
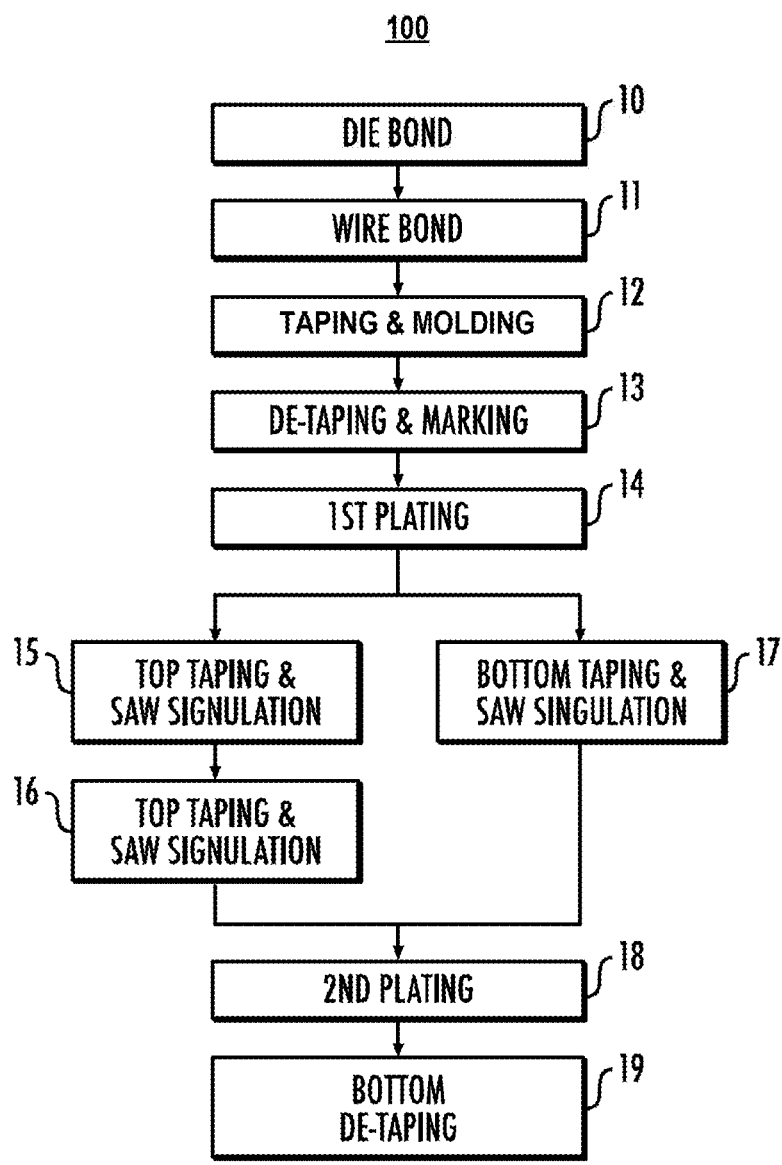
FIG. 1 is a flow diagram of an illustrative method for forming wettable flanks on a semiconductor die package from a package assembly, according to an example.

Certain terminology is used in the following description for convenience only and is not limiting. The words "right," "left," "top," and "bottom" designate directions in the drawings to which reference is made. However, it will be understood that such orientation-based terms are for reference only and that the embodiments may be implemented in different directions such that such terms may be applied as adjusted based on such respective different directions. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof.

The description provided herein is to enable those skilled in the art to make and use the described embodiments set forth. Various modifications, equivalents, variations, combinations, and alternatives, however, will remain readily apparent to those skilled in the art. Any and all such modifications, variations, equivalents, combinations, and alternatives are intended to fall within the spirit and scope of the present invention defined by claims.

Techniques are disclosed herein for forming bottom and sidewall wettable flanks on semiconductor die packages, and, preferably, DFN and/or QFN semiconductor die packages. The techniques include a package assembly having multiple non-singulated packages. The package assembly includes a lead frame having dies and other internal package components (e.g., wire bonds) coupled thereto. The dies and other components form different regions of non-singulated packages, as further disclosed herein. The dies and other components are encapsulated within a mold encapsulation (also referred to as a "molding," "mold," "encapsulation," "encapsulation material," "mold encapsulation material", or other similar term herein). The mold encapsulation may be non-conductive and may cover all or most of the package components but may leave exposed certain electrical contact pads (referred to herein as "leads," including a "first lead" and a "second lead") and, possibly, thermal contact pads (referred to herein as "die paddles") as well as other components as disclosed herein. The mold encapsulation may include a top major surface that is opposite to the bottom surface of the plurality of leads and a bottom major surface that is adjacent and substantially parallel to the bottom surface of the plurality of the leads. The lead frame provides a continuous electrical connection between one end of the package assembly and the other, and between the various exposed leads and die paddles of the semiconductor die packages. Elements such as wire bonds or die bars may assist with forming the electrical connection. This electrical connection may be used for current flow during electroplating (e.g., a first electrical plating), which may be a step that occurs in the process for forming bottom and sidewall wettable flanks on DFN and/or QFN packages.

Figure 2A:
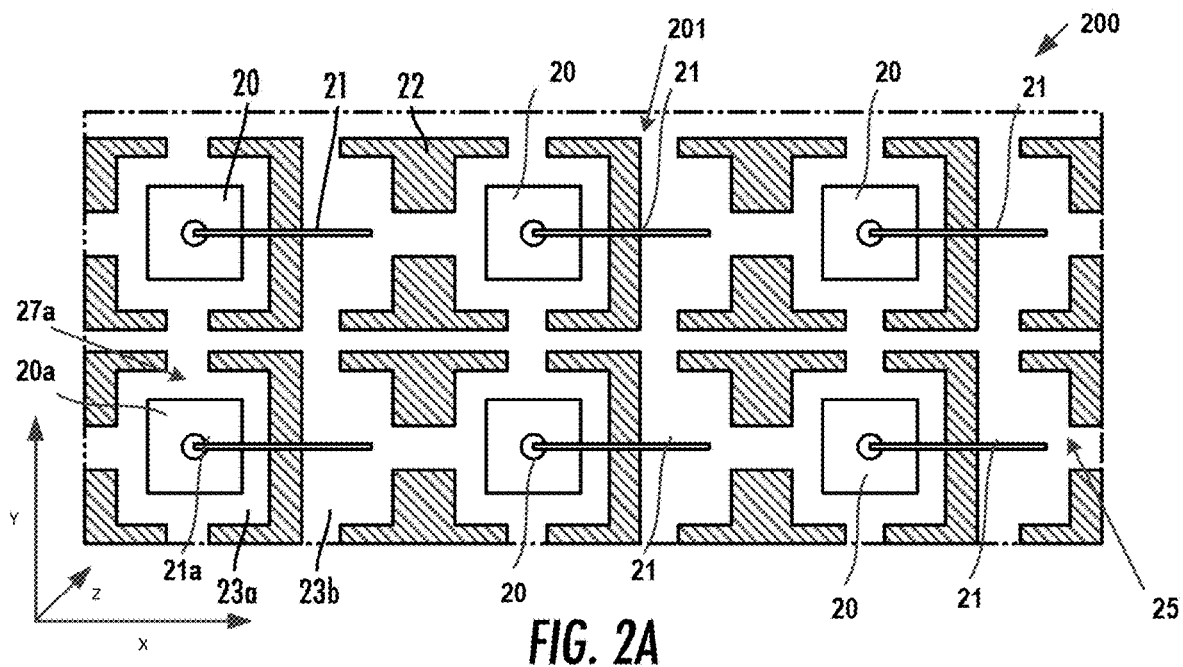
FIG. 2A is a top view of a package assembly illustrating a lead frame with dies in a mold encapsulation, according to an example.
Figure 2B:
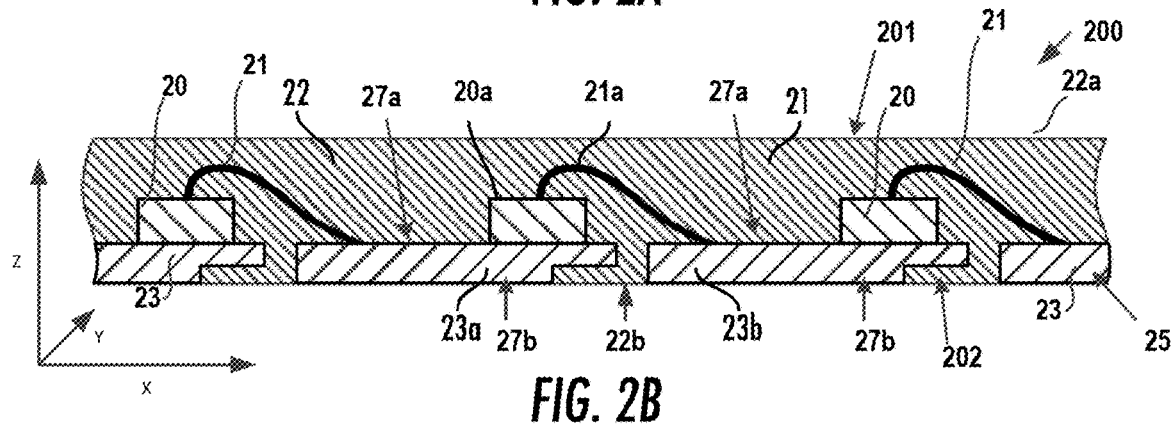
FIG. 2B is a cross-sectional view of the package assembly of FIG. 2A, according to an example.
Figure 2C:
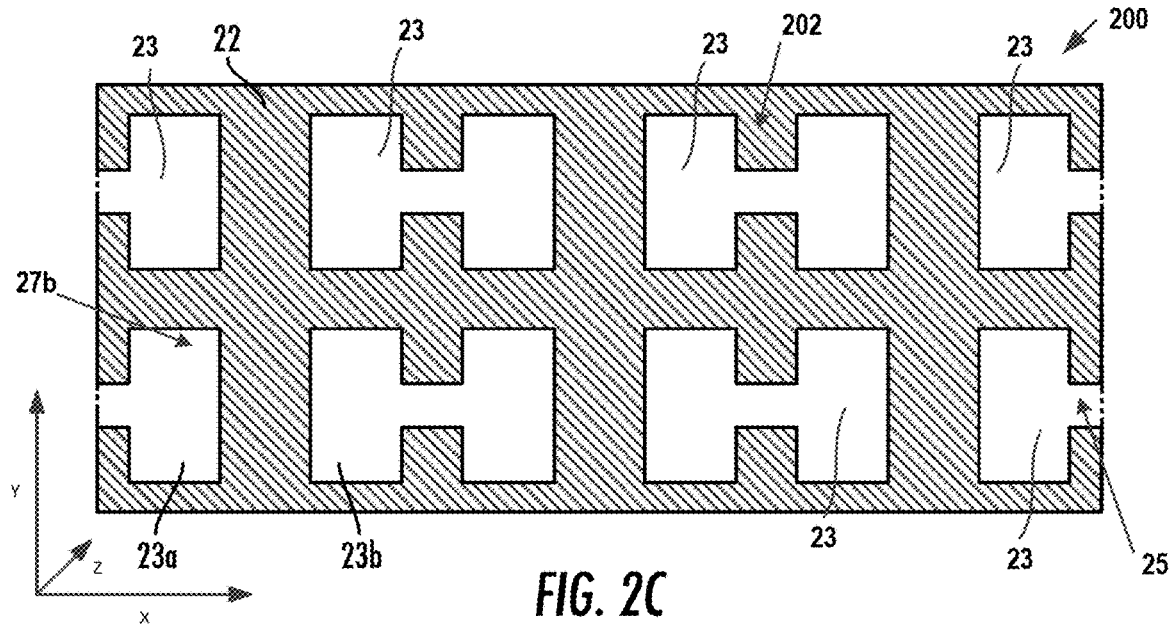
FIG. 2C is a bottom view of the package assembly of FIG. 2A, according to an example.

FIG. 1 shows a flow diagram of a process 100 for forming a semiconductor die packages from a package assembly, according to an aspect of the present invention. The process 100 of FIG. 1 is discussed in conjunction with FIGS. 2-11, which illustrate stages of a package assembly 200 as the process 100 proceeds. A lead frame 25, as referenced herein, may be cut from a lead frame material such as a sheet of copper. A lead frame assembly, as referenced herein, may be the lead frame 25 having a plurality of leads 23. As shown in FIGS. 2A-2C, the leads 23 may be etched into portions of the lead frame 25.

The package assembly 200 is shown with a top surface 201 and a bottom surface 202, as indicated in FIGS. 2A-2C. At step 10 of the process 100, a plurality of die 20 are deposited on and bonded to a corresponding plurality of leads 23 of a lead frame 25 that are part of the lead frame assembly. The lead frame assembly may include multiple leads 23 integrated into a single part or unit. The lead frame assembly may include any metal alloy. A plurality of semiconductor die packages may be formed in an array of die packages in the package assembly 200, which are then cut (e.g., singulated) into individual semiconductor die packages. Each semiconductor die package may include a second portion (e.g., 24b as described in FIG. 5B) of a lead 23 (e.g., 23a) that is attached to a die 20, a first portion (e.g., 25a as described in FIG. 5B) of a lead 23 (e.g., 23b) that is electrically connected to the die 20 (e.g., by wire 21 or a die-bar (not shown)), and mold encapsulation 22. A singulated semiconductor die package may be a semiconductor die package that is separated from one or more other semiconductor die packages in the package assembly, as further described herein.

At step 10, one or more of the integrated circuit dies, which are referred to herein as "dies," for simplicity, may be deposited on the leads 23 of the lead frame 25. At step 11, other components, such as wires 21, conductive clips (elements within the semiconductor die package that couple the die(s) to one or more leads), or other elements are deposited to form a plurality of semiconductor die packages.

At step 12, a portion of the lead frame 25 is taped, and a mold encapsulation 22 is deposited around the lead frame 25 and other components of the semiconductor die packages. Notably, a bottom portion of the lead frame that faces away from the wire bonds formed by wires 21 deposited at step 11 may be taped to prevent the mold encapsulation deposited at step 12 to extend past the base of the lead frame 25 such as through gaps between two or more leads 23 in the lead frame 25. The mold encapsulation 22 may provide a physical and electrical barrier for the components of the package. The mold encapsulation 22 may be a silica-filled resin, a ceramic, a halide-free material, or other protective encapsulation material, or a combination thereof. The mold encapsulation 22 may be formed by molding thermosetting materials in a process where a plastic is softened by heat and pressure in a transfer chamber, then forced at high pressure through suitable sprues, runners, and gates into a closed mold for final curing. The mold encapsulant may also be formed by using a liquid which may be heated to form a solid by curing in a UV or ambient atmosphere, or by using a solid that is heated to form a liquid and then cooled to form a solid mold. At step 13, the lead frame 25 may be de-taped, after step 12, and one or more markings (not shown) may be applied to the lead frame assembly. The markings may include one or more fiducial marks which are marks detectable by a machine that allow the machine to align itself for cutting. After step 13, a package assembly 200 is provided that includes multiple non-singulated semiconductor die packages with package components (e.g., dies, the lead frame, and the components that couple the dies to the lead frame) encapsulated within a molding material 22.

FIG. 2A shows a top view of a package assembly 200 with a top major surface 22 of the mold encapsulation 22 after step 13 of the process 100 of FIG. 1. As shown in FIG. 2A, a plurality of leads 23 are provided as part of a lead frame 25. A die 20 is deposited on each of the leads 23 on a die surface 27a of the leads (e.g., top surface, as shown in FIG. 2B). As shown in FIG. 2B, a given die 20a is deposited on a given first lead 23a of the plurality of leads 23 and may be electrically connected to an adjacent lead (e.g., second lead 23b), of the plurality of leads. The electrical connections may be implemented using wires 21, such as a given wire 21a, bonded to the given die 20a deposited on a die surface 27 of the first lead 23a, the given wire 21a connecting to a die surface 27a of a second lead 23b. Similarly, the plurality of dies 20 are deposited on respective leads 23 and are electrically connected to adjacent leads 23 using wire bonds. Portions of mold encapsulation 22 are shown in FIG. 2A, though it will be understood that the mold encapsulation 22 covers the lead frame and associated components, as seen from the cross-sectional view shown in FIG. 2B. In an embodiment, the mold encapsulation 22 may be partially or fully opaque and may be of a given color (e.g., black, grey, etc) such that the lead frame and associated components may not be visible from a top view. However, it will be understood that in the top view, as shown in FIG. 2A, the mold encapsulation 22 is shown as transparent for illustrative purposes, such that the lead frame and associated components are visible in FIG. 2A Leads 23a and 23b, die 20a, and wire 20a are referenced herein for exemplary purposes; however, one of ordinary skill in the art would understand that the same description generally applies for each of the plurality of leads 23, dies 20, and wires 21.

FIG. 2B shows a cross-sectional view of the package assembly 200 of FIG. 2A, after step 13 of the process 100 of FIG. 1. As shown in FIG. 2B, the plurality of leads 23 (e.g., first lead 23a and second lead 23b) are provided as part of a lead frame 25. The plurality of dies 20 are deposited onto the leads 23 (e.g., 23a and 23b) and a given die 20a is deposited on a first lead (e.g., 23a), of the plurality of leads 23, may be electrically connected to a second lead (e.g., 23b), of the plurality of leads using electrical connections using wires (e.g., wire 21), as disclosed herein. Similarly, a plurality of dies 20 (e.g., die 20a) are deposited on respective leads 23 (e.g., 23a) and are electrically connected to adjacent leads (e.g., 23b) using wires 21. As shown, mold encapsulation 22, encapsulates the dies 20, plurality of leads 23 and may be provided between the space between adjacent leads (e.g., between lead 23a and lead 23b). Further, the mold encapsulation 22 also encapsulates other components such as wires 21 (e.g., wire 21a).

FIG. 2C shows a bottom view of the package assembly 200 of FIGS. 2A and 2B, after step 13 of the process 100 of FIG. 1. As shown in FIG. 2C, a plurality of leads 23 (e.g., leads 23a and 23b) may be arranged in an array configuration. FIG. 2C shows the plating surface 27b (e.g., bottom surface) of leads 23a and 23b which may be adjacent to each other in an X direction. As further noted herein, leads 23 that are adjacent to each other in a Y direction (e.g., top and bottom in FIG. 2C) may be independent from each other during the semiconductor package fabrication, as disclosed herein.

At step 14 of the process 100 of FIG. 1, a bottom surface of the plurality of leads 23 of the lead frame may be plated with a first electrical plating 30. The plating surface 27b of the plurality of leads 23 may be the surface of the plurality of leads 23 that is opposite from the surface of the plurality of leads 23 that is bonded to the wires 21 deposited at step 11. Notably, the plating surface 27b of the plurality of leads 23 is the surface of the leads that is not covered by the molding material.

Figure 3:
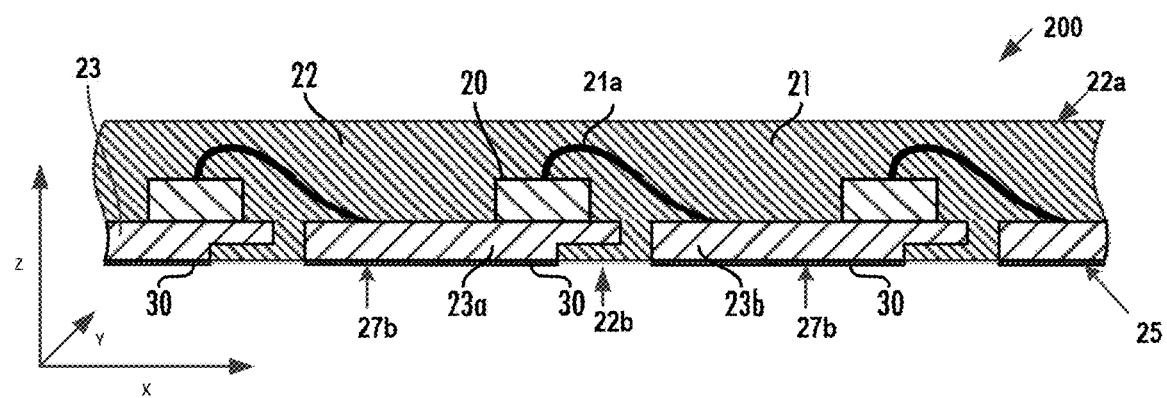
FIG. 3 is a cross-sectional view of a package assembly with bottom plating, according to an example.

A first electrical plating 30 may be applied by an electroplating process, at step 14 of the process 100 of FIG. 1, as shown in FIG. 3. The first electrical plating 30 may include one or more layers of a metal, such as tin or a tin alloy, plated on the plating surface 27b of the leads 23 and may protect the plating surface 27b of the leads 23 from oxidation and may also provide a wettable surface for soldering. The electroplating process may include depositing a conductive plating material that covers the plating surface (e.g., bottom surface) of the plurality of leads 23 of the lead frame 25 and allows for solder to adhere to the leads 23. A first electrical plating 30 material may be deposited on the exposed plating surfaces 27b (e.g., exposed bottom surfaces) of the leads 23. During the electroplating process of step 14, the lead frame 25 may be dipped in a bath and the lead frame 25 may be electrically coupled to the cathode of an electrolytic plating device (not shown). The anode of the electrolytic plating device may be coupled to the plating material, which is also dipped in the bath. An electrical current may be applied to the lead frame which causes the plating material to be deposited on the plating surface 27b (e.g., bottom surface) of the plurality of leads 23 so that, for example, the plating surface 27b of leads 23a and 23b are plated with the plating material. At step 14, because only the plating surfaces 27b of the leads 23a and 23b are exposed, only these surfaces are plated by the first electrical plating 30. Notably, sidewalls 55 and 56, as further disclosed herein, of the leads 23a and 23b, which are not exposed, are not electrolytically plated. The first electrical plating 30 material may be any of a variety of plating materials, such as tin, gold, palladium, or silver.

After step 14 of the process 100 of FIG. 1, one of two processes may be taken, as shown in FIG. 1. A first process is described at steps 15, 16, 18, and 19 of FIG. 1 and illustrated in FIGS. 4-8, and a second process is described at steps 17, 18, and 19 of FIG. 1 and illustrated at FIGS. 9-11.

Referring to the first process, at step 15, top taping and saw singulation are performed as further described herein.

Figure 4:
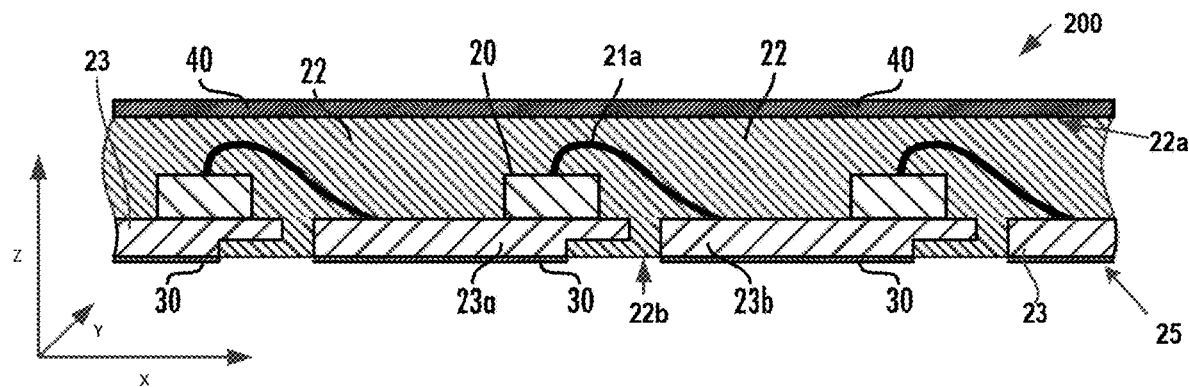
FIG. 4 is a cross-sectional view of the package assembly with a film applied on a top surface, according to an example.

According to an embodiment, step 15, top taping and saw singulation, of the process 100 of FIG. 1 may be taken after applying the first electrical plating 30 to the bottom exposed surfaces of the leads 23 (e.g., leads 23a and 23b of FIG. 3) at step 14 of the process 100. At step 15, as shown in FIG. 4, a first connecting film 40 may be applied to the top major surface 22a of the mold encapsulation 22. As shown, the connecting film 40 may be applied over a plurality of the leads 23 (e.g., leads 23a and 23b). The connecting film 40 may be any applicable film that attaches to the top major surface 22a of the mold encapsulation 22. The connecting film 40 may attach to the top major surface of the mold encapsulation 22 using any applicable adhesive material.

Figure 5A:
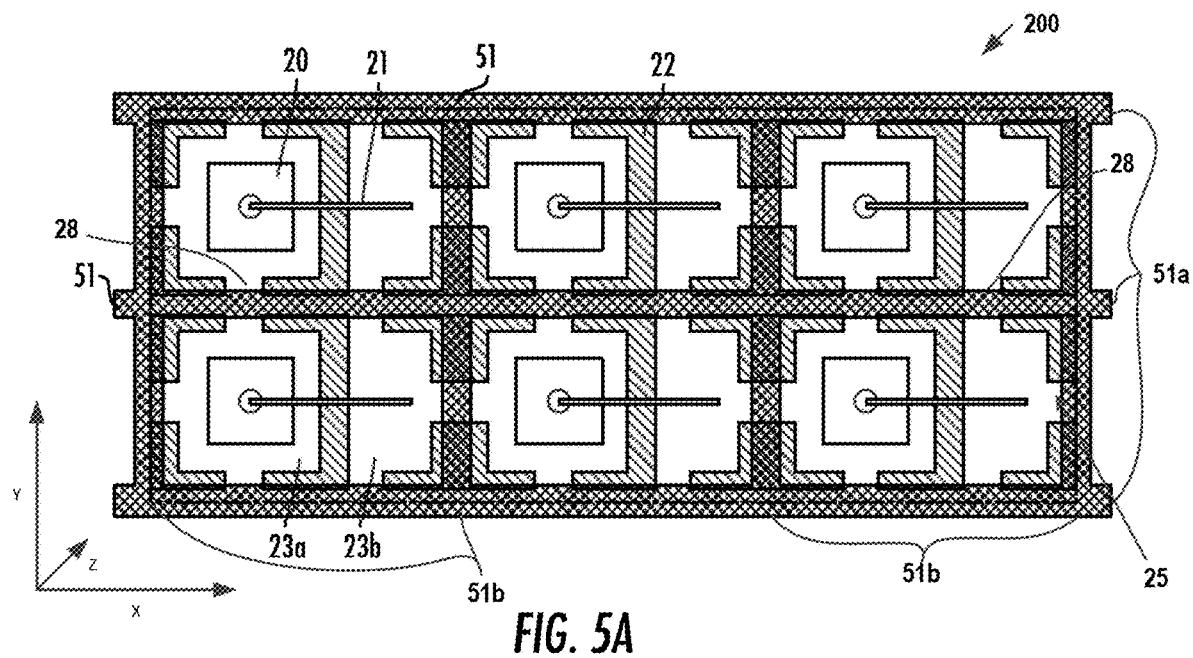
FIG. 5A is a top view of package assembly illustrating the cuts and cutting pattern that create channels within the package assembly, according to an example.
Figure 5B:
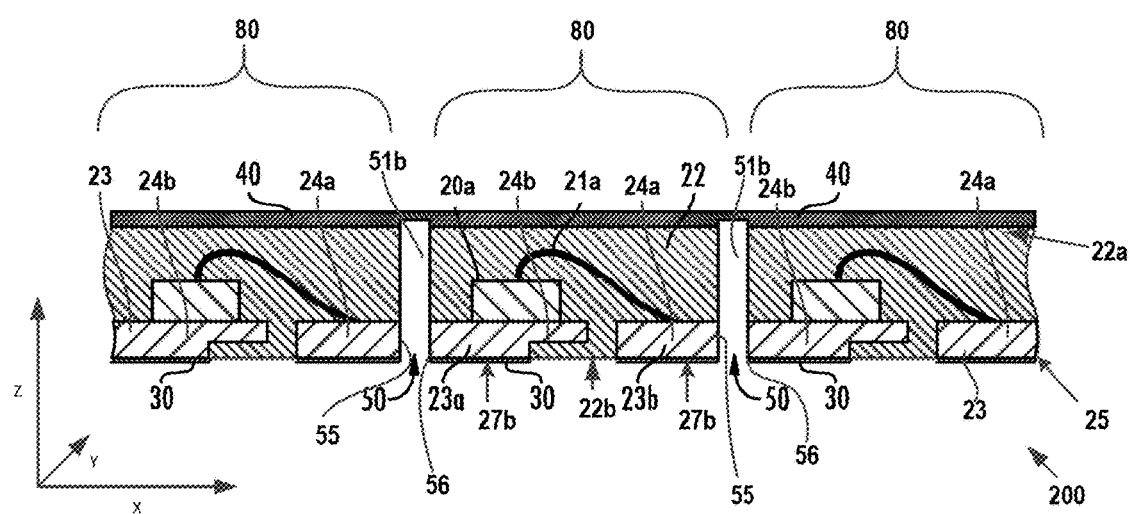
FIG. 5B is a cross-sectional view of the package assembly of FIG. 5A, according to an example.
Figure 5C:
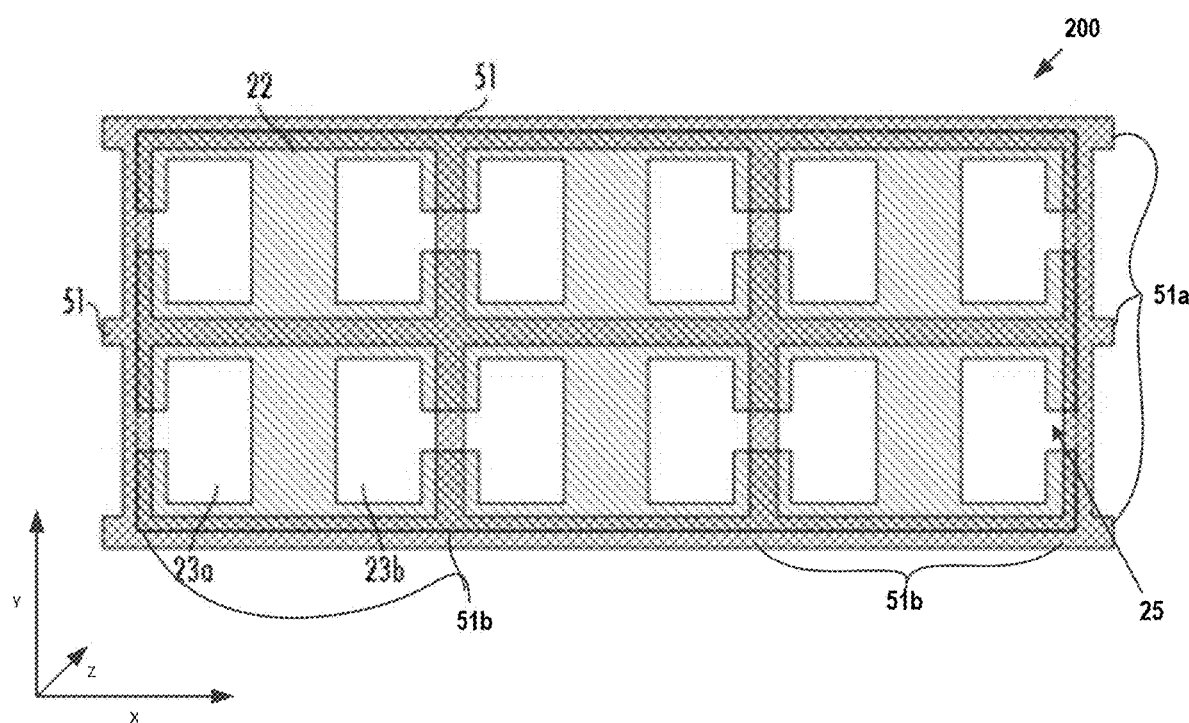
FIG. 5C is a bottom view of the package assembly of FIG. 5A, according to an example.

Step 15 of the process 100 of FIG. 1 includes a singulation process. The singulation process at step 15 may be implemented using an applicable cutting device and/or technique such as, without limitation, a saw having a saw blade, or a laser cutter, a plasma cutter, or a water jet cutter, or any other acceptable cutting device and/or technique as known to those of skill in the art. The singulation process at step 15 may include making one or more cuts through the first electrical plating 30 on the plating surface 27b (e.g., bottom surface) of the plurality of leads 23 through the top major surface 22a of the mold encapsulation 22 to create one or more channels 50. The channels 50 may each expose lead sidewalls 55 and 56 on each side of each of the channels. As shown in FIGS. 5A-5C, the lead frame 25 may be singulated into individual semiconductor die packages 80. The singulation process may include making a first series of parallel cuts 51a along a first direction (e.g., an X direction) cutting through the bottom major surface 22b (e.g., opposed major surface) of the mold encapsulation 22 opposite of the connecting film 40 to a depth up to the connecting film 40 or a portion of the connecting film 40. The first series of parallel cuts 51a may also cut through a portion of the lead frame 25 that is between adjacent leads 23 in the vertical direction (e.g., through lead connectors 28). As applied herein, lead connectors 28 may connect two adjacent leads and may be part of a lead frame (e.g., lead frame 25) itself or may be formed from one or more other materials. Notably, this first series of parallel cuts 51a only cut through the area between adjacent leads 23 (e.g., leads arranged above or below each other in the Y direction if viewing the package assembly 200 from a top view), and do not cut through the leads 23. The singulation process may further include making a second series of parallel cuts 51b along a second direction (e.g., a Y-direction), the second direction substantially perpendicular to the first direction, the second series of parallel cuts cutting through the plating surface 27b (e.g., bottom surface) of each of the plurality of leads 23, and the electrical plating 30 of each of the plurality of leads 23, and the mold encapsulation 22 to a depth up to the connecting film 40 or a portion of the connecting film 40 to create a channel 50 exposing a first lead sidewall 55 and a second lead sidewall 56 of each of the plurality of leads 23.

The first and/or second, series of parallel step cuts 51a and 51b, between the semiconductor die packages 80 create sidewalls 55 and 56 where wettable flanks will be formed. The first and second series of parallel cuts 51a and 51b may be made at a depth not fully through the connecting film 40 shown in FIG. 4 and FIGS. 5A-C, to allow the packages to remain as a single assembly for additional handling in subsequent steps.

FIG. 5A shows a top view of a package assembly 200 at step 15 of process 100 of FIG. 1. As shown in FIG. 5A, a plurality of cuts 51 (e.g., 51a and 51b) may be made during a singulation process. The top view shown in FIG. 5A is a top view from below connecting film 40 (not shown in FIG. 5A). The plurality of cuts may include a series of parallel cuts 51a in the X direction (e.g., from a left side to a right side of the package assembly 200 shown in FIG. 5A), as well a series of parallel cuts 51b in the Y direction, as indicated by the axis provided in FIG. 5A. The series of parallel cuts in the X direction 51a may cut through the bottom major surface 22b (e.g., opposed major surface) of the mold encapsulation 22 opposite of the connecting film 40 (shown in corresponding FIG. 5B) to a depth up to the connecting film 40 or a portion of the connecting film 40. Notably, according to the example shown in FIGS. 5A-C, the leads 23 in the package assembly 200 are configured such that adjacent leads (e.g., 23a and 23b) in the X direction are connected by wires 21, and adjacent leads 23 in the Y direction may be connected by lead connectors 28 or may be independent of each other during fabrication of semiconductor die packages, as disclosed herein. It will be noted that the cuts 51a and 51b are shown in the top view of FIG. 5A are from below the connecting film 40 (not shown in FIG. 5A) as the cuts 51 do not extend through the connecting film 40 that is above the mold encapsulation 22 shown in FIG. 5A. The cuts 51b in the Y direction create channels 50 (as shown in FIG. 5B) that cut through each of the plurality of leads 23 (e.g., leads 23a and 23b) whereas the cuts 51a in the X direction may not cut through the plurality of leads 23 but rather separate adjacent leads in the Y direction from each other by cutting through the mold encapsulation 22 and/or lead connectors 28.

FIG. 5B shows a cross-section view of the package assembly 200 of FIG. 5A, during step 15 of the process 100 of FIG. 1. FIG. 5B shows a series of parallel cuts 51b made in the Y direction to create a plurality of channels 50. Notably, the series of parallel cuts 51b in the Y direction cut through the first electrical plating 30 on the plating surface 27b (e.g., bottom surface) of the plurality of leads 23 (e.g., leads 23a and 23b), through the plurality of leads 23, and through the mold encapsulation 22. FIG. 5B shows the channels 50 extending partially into the connecting film 40, though it will be understood that, according to an embodiment, the channels 50 may be formed up to, but not through a portion of the connecting film 40. As shown in FIG. 5B, at least a portion of the connecting film 40 is contiguous over the major top surface 22a of the mold encapsulation 22 across multiple leads 23. Notably, the connecting film 40 may have properties (e.g., strength, rigidity, elasticity, etc.) that enable the connecting film 40 to maintain the plurality of semiconductor die packages 80 of the package assembly 200 that are separated by the channels 50, to remain as part of a single unit connected by the connecting film 40. For example, the connecting film 40 may enable the plurality of semiconductor die packages 80 of the package assembly 200 plus the plurality of channels 50 to have a width, in an X direction, that is substantially equal to the width of the package assembly 200 before the plurality of cuts at step 15 of process 100 (e.g., the width of the package assembly 200 prior to step 15, as shown in FIG. 4).

As shown in FIG. 5B, the channels 50 expose lead sidewalls 55 and 56 of each of the plurality of leads 23 (e.g., leads 23a and 23b). The lead sidewalls 55 and 56 are created during the formation of the channels 50 such that the formation of the channels 50 cuts through each of the plurality of leads 23 (e.g., leads 23a and 23b) to expose two lead sidewalls 55 and 56 of each of the plurality of leads 23. The lead sidewalls 55 and 56 correspond to the portions of the leads that face the respective channels 50. Notably, the channels 50 are created between a first portion 24a and second portion 24b of each of the plurality of leads 23. The first portion 24a preferably includes a wire 21 (e.g., wire 21a) bonded to the die surface 27a of the first portion 24a of the plurality of leads 23 and the second portion 24b preferably includes a die 21 (e.g., die 20a). As shown in FIG. 5B, for example, after the plurality of cuts 51a and 51b, each semiconductor die package 80 of the package assembly 200 includes a second portion 24b of a first lead 23a, including die 20a, and a first portion 24a of a second lead 23b, including wire 21a bonded to a die surface 27a of the first portion 24a of the second lead 23b.

FIG. 5C shows a bottom view of the package assembly 200 of FIGS. 5A and 5B, at step 15 of the process 100 of FIG. 1. As shown in FIG. 5C, the plurality of cuts 51 include a series of parallel cuts 51a in the X direction (e.g., from a left side to a right side of the package assembly 200 shown in FIG. 5C), as well a series of parallel cuts 51b in the Y direction (e.g., from a top to a bottom of the package assembly 200 shown in FIG. 5C). The series of parallel cuts in the X direction cut through the bottom major surface 22b (e.g., opposed major surface) of the mold encapsulation 22 opposite of the connecting film 40 (shown in corresponding FIG. 5B) to a depth up to the connecting film 40 or a portion of the connecting film 40. The cuts 51b in the Y direction create channels 50 (as shown in FIG. 5B) that cut through each of the plurality of leads 23 (e.g., leads 23a and 23b) whereas the cuts 51a in the X direction do not cut through the plurality of leads 23 but rather separate adjacent leads 23 in the Y direction from each other by cutting through the mold encapsulation 22 and/or lead connectors 28. As disclosed herein, the first series of parallel cuts 51a may also cut through a portion of the lead frame 25 that is between adjacent leads 23 in the vertical direction (e.g., if the lead connectors 28 are part of the lead frame 25).

Figure 6:
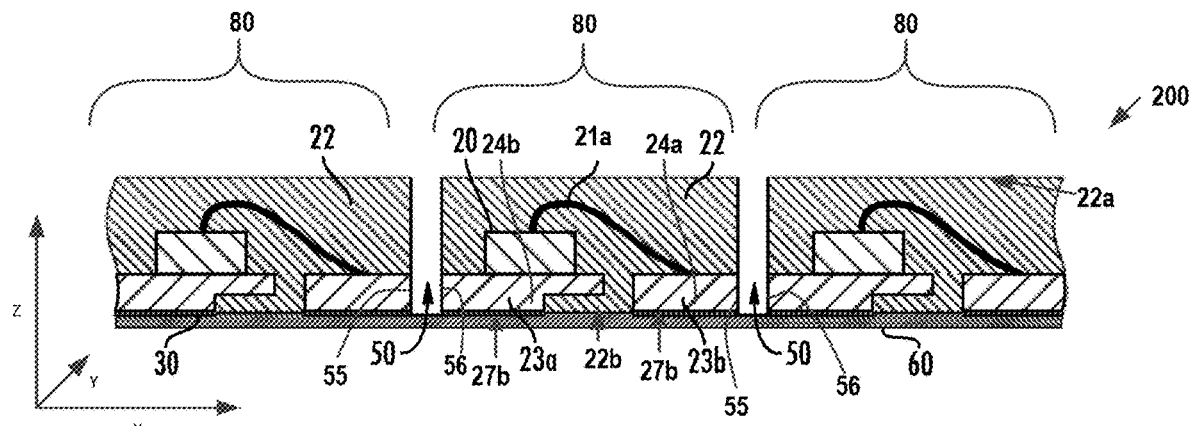
FIG. 6 is a cross-sectional view of a package assembly after cutting with a conductive film attached, according to an example.

At step 16 of the process 100 of FIG. 1, as shown in FIG. 6, a conductive film 60 is applied to the bottom of the semiconductor die packages 80 of the package assembly 200 that are separated by channels 50. The conductive film 60 may be applied while the connecting film 40 of FIGS. 4 and 5B is attached to the top major surface 22a of the mold encapsulation 22 such that the semiconductor die packages 80 of the package assembly 200 maintain their position and/or structure while the conductive film 60 is applied. The connecting film 40 of FIGS. 4 and 5B may be removed at step 16 of process 100 such that the semiconductor die packages 80 of the package assembly 200 may be connected to each other by the conductive film 60. Notably, the conductive film 60 may have properties (e.g., strength, rigidity, elasticity, etc.) that enable the conductive film 60 to maintain the plurality semiconductor die packages 80 of the package assembly 200 that are separated by the channels 50, to remain as part of a single unit connected by the conductive film 60. For example, the conductive film 60 may enable the plurality of semiconductor die packages 80 of the package assembly 200 plus the plurality of channels 50 to have a width, in an X direction, that is substantially equal to the width of the package assembly 200 before the removal of the connecting film 40 at step 16 of process 100 (e.g., the width of the package assembly 200 prior to step 16, as shown in FIG. 5B). The conductive film 60 may be made from any applicable material that conducts electricity such that an electrical path is maintained between segments of the package assembly 200 separate by channels 50. For example, the conductive film 60 may be made from or may include metal or metal alloys. It will be noted that although conductive film 60 is described herein, the conductive film 60 may also be a connecting film.

The conductive film 60 is preferably applied to a bottom of the semiconductor die packages 80 of the package assembly 200, as shown in FIG. 6. The conductive film 60 is more preferably applied to one or more of the bottom major surface 22b of the mold encapsulation 22 and/or the first electrical plating 30 on the plating surface 27b (e.g., bottom surface) of the plurality of leads 23.

Figure 7:
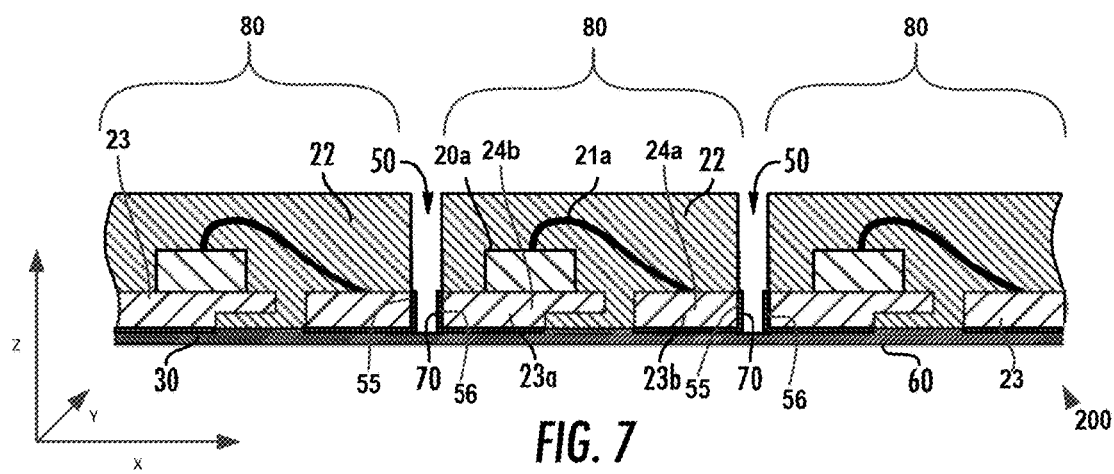
FIG. 7 is a cross-sectional view of the package assembly with a conductive film and sidewall electric plating, according to an example.

After applying the conductive film 60 to the bottom of the semiconductor die packages 80 of the package assembly 200 and removing the connecting film 40 from the top of the semiconductor die packages 80 of the package assembly 200 at step 16, the lead sidewalls 55 and 56 of the plurality of leads 23 may be plated at step 18 of the process 100 of FIG. 1. As shown in FIG. 7 a second electrical plating 70 may be applied by an electroplating process, at step 18 of the process 100 of FIG. 1. The second electrical plating 70 may be one or more layers of a metal such as tin or a tin alloy that plated on the lead sidewalls and may protect the lead sidewalls from oxidation and may also provide a wettable surface for soldering. The electroplating process at step 18 may include depositing a conductive plating material to cover the exposed surface of lead sidewalls 55 and 56 e.g., through the channels 50). During the electroplating process of step 18, the semiconductor die packages 80 of the package assembly 200, connected by the conductive film 60, may be dipped in a bath and may be electrically coupled to the cathode of an electrolytic plating device. The anode of the electrolytic plating device may be coupled to the plating material, which is also dipped in the bath. An electrical current may be applied to the semiconductor die packages 80 of the package assembly 200, connected by the conductive film 60, which causes the plating material to be deposited on the exposed surface of the lead sidewalls 55 and 56 of the plurality of leads so that, for example, the exposed surface of the lead sidewalls of leads 23a and 23b are plated with the plating material (electrical plating 70). At step 18, because only the sidewalls 55 and 56 of the leads 23a and 23b are exposed, only these surfaces are plated by the second electrical plating 70. Notably, after applying the second electrical plating 70 at step 18, at least two surfaces of each portion 24a and 24b of a lead (e.g., a first portion and second portion 24a and 24b of lead 23b) are covered by electrical plating (e.g., first electrical plating 30 on a plating surface and second electrical plating on a sidewall surface).

Figure 8:
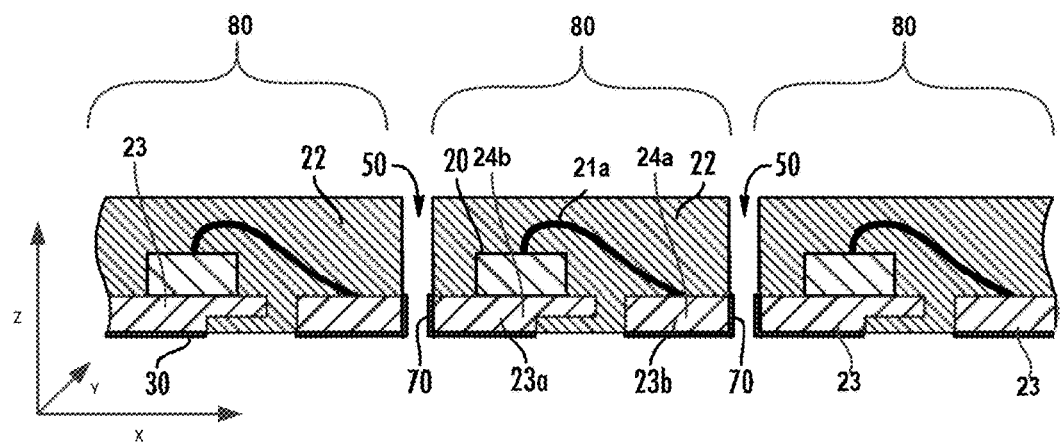
FIG. 8 is a cross-sectional view of finished semiconductor die packages with bottom and sidewall electric plating, according to an example.

At step 19 of the process 100 of FIG. 1, the conductive film 60 is removed, as shown in FIG. 8. After removal of the conductive film 60 at step 19, a plurality of semiconductor die packages 80 corresponding to each of the plurality of package assembly 200 segments of FIG. 7 remain. Each of the plurality of semiconductor die packages 80 include a first portion 24a of a lead 23 (e.g., lead 23b), a die 20 (e.g., die 20a) deposited over a second portion 24b of a lead 23 (e.g., lead 23a), a wire 21 (e.g., wire 21a) electrically connecting the die 20 (e.g., die 20a) to a first portion 24a of the lead 23 (e.g., a first portion 24a of lead 23b). Additionally, each of the portions 24a and 24b of leads 23 for each of the plurality of semiconductor die packages 80 include electrical plating material on the plating surfaces 27b (e.g., bottom surfaces) of the portions of the leads as well as the sidewall surfaces 55 and 56 of each of the leads 23.

Figure 9:
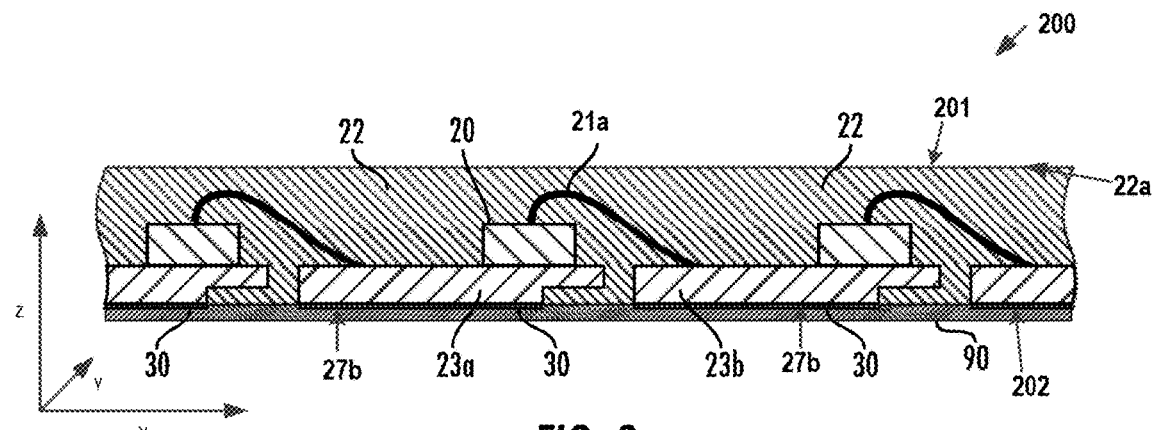
FIG. 9 is a cross-sectional view of another embodiment of a package assembly with bottom electric plating and a conductive film, according to an example.

Referring to the second process, at step 17 bottom taping and saw singulation are performed as an alternative to steps 15 and 16 of process 100 of FIG. 1. FIG. 9 shows an example of step 17 which may include applying a conductive film 90 to the bottom surface 202 of the package assembly 200 after step 14 of the process 100 of FIG. 1. To clarify, as shown in FIG. 1, step 17 follows step 14 of the process 100 of FIG. 1 such that step 17 is performed after the first electrical plating 30 is applied to the plating surface 27b (e.g., bottom surface) of the leads 23. The conductive film 90 applied at step 17 may be attached to the one or both of the bottom major surface 22b of the mold encapsulation 22 and/or the first electrical plating 30 on the plating surface 27b (e.g., bottom surface) of the plurality of leads 23.

Figure 10A:
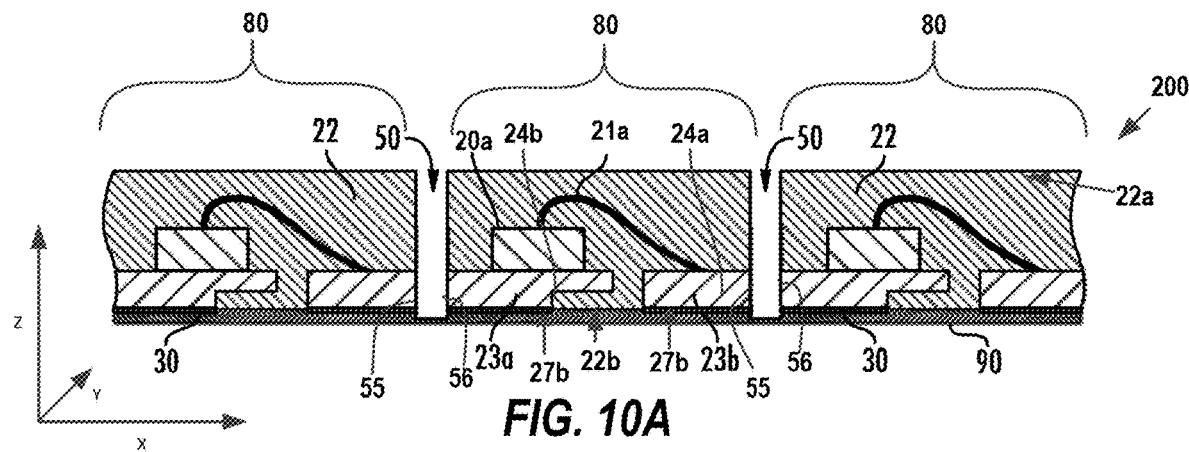
FIG. 10A is a cross-sectional view of the package assembly after cutting to create channels within the package assembly, according to an example.
Figure 10B:
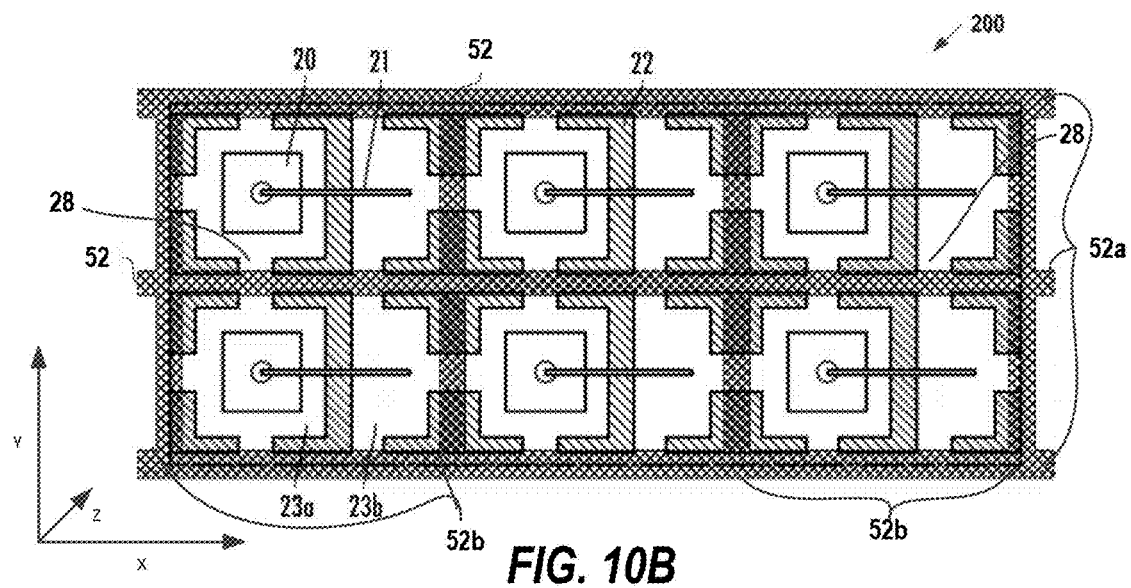
FIG. 10B is a top view of the package assembly after cutting to create channels within the package assembly, according to an example.

As shown in FIGS. 10a and 10b, step 17 includes a singulation process, such as a saw singulation process described in relation to step 15 of process 100 of FIG. 1. FIG. 10A shows a cross-section view of the package assembly 200 and FIG. 10B shows a top view of the package assembly 200 at step 17. The singulation process at step 17 may be implemented using an applicable cutting device and/or technique such as a saw having a saw blade, or a laser cutter, a plasma cutter, or a water jet cutter, or any other acceptable cutting device and/or technique as known to those of skill in the art. As further described herein, the singulation process at step 17 may include making one or more cuts 52 (e.g., 52a and/or 52b) through the top major surface 22a of the mold encapsulation 22 through the plurality of leads 23 (e.g., leads 23a an 23b) to create one or more channels 50. The channels 50 may each include exposed lead sidewalls 55 and 56 on each side of each of the channels. The package assembly 200 may be singulated into individual semiconductor die packages 80 connected only by the conductive film 90. The singulation process at step 17 may include making a first series of parallel cuts 52a along a first direction (e.g., an X direction) cutting through the top major surface 22a of the mold encapsulation 22 opposite of the conductive film 90 to a depth down to the conductive film 90 or a portion of the conductive film 90. Notably, this first series of parallel cuts 52a only cut through lead connectors 28, as shown in FIG. 5A, and the area between adjacent electrically unconnected leads (e.g., leads arranged above or below each other if viewing the package assembly 200 from a top view, as shown in FIG. 10B), and do not cut through the leads 23. The first series of parallel cuts 52a may also cut through a portion of the lead frame 25, such as the lead connectors 28, that is between adjacent leads 23 in the vertical direction. The singulation process may further include making a second series of parallel cuts 52b along a second direction (e.g., a Y direction), the second direction substantially perpendicular to the first direction, the second series of parallel cuts 52b cutting through the top major surface 22a of the mold encapsulation 22 surface, down through plurality of leads 23, and through the first electrical plating 30 of each of the plurality of leads to a depth up to the conductive film 90 or a portion of the conductive film 90 to create channels 50 exposing a first lead sidewall 55 and a second lead sidewall 56 of each of the plurality of leads 23. It will be noted that although conductive film 90 is described herein, the conductive film 90 may also be a connecting film.

The first and/or second series of parallel step cuts 52a and/or 52b between the semiconductor die packages 80 that form the channels 50 result in exposed sidewalls that will form wettable flanks. The first and second series of parallel cuts 52a and 52b may be made at a depth that does not extend fully through the conductive film 90, to allow the semiconductor die packages 80 to remain as a single assembly for additional handling in subsequent steps. Notably, the conductive film 90 may have properties (e.g., strength, rigidity, elasticity, etc.) that enable the conductive film 90 to maintain the plurality of semiconductor die packages 80 of the package assembly 200, that are separated by the channels 50, to remain as part of a single unit connected by the conductive film 90. For example, the conductive film 90 may enable the semiconductor die packages 80 of the package assembly 200 plus the plurality of channels 50 to have a width, in an X direction, that is substantially equal to the width of the package assembly 200 before the singulation at step 17 (e.g., the width of the package assembly 200 prior to step 17, as shown in FIG. 3). The conductive film 90 may be made from any applicable material that conducts electricity such that an electrical path is maintained between segments of the package assembly 200 separated by channels 50. For example, the conductive film 90 may be made from or may include metal or metal alloys.

Figure 11:
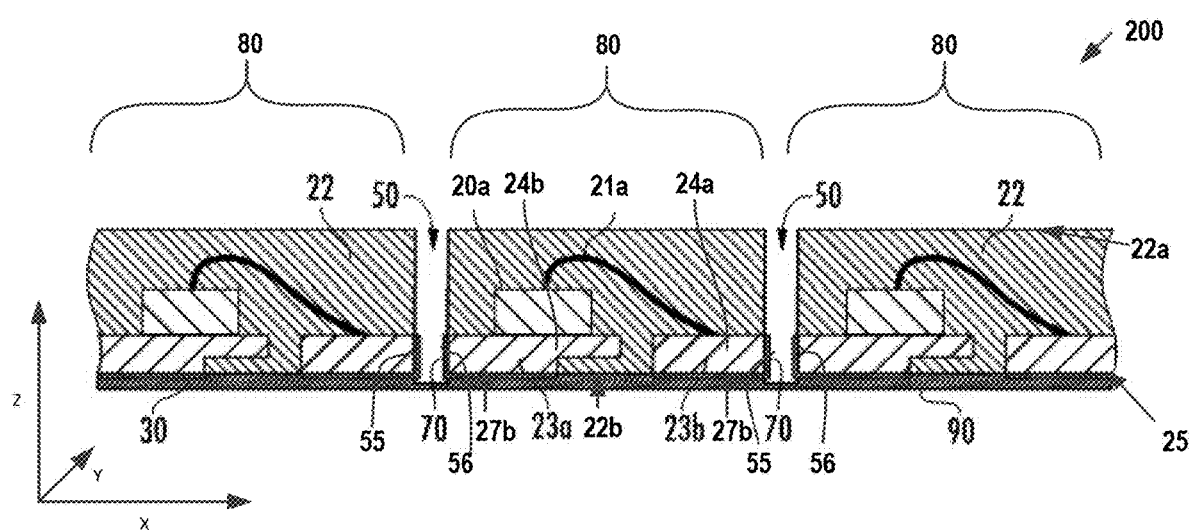
FIG. 11 is a cross-sectional view of the package assembly with a conductive film and sidewall electric plating.

As described herein, steps 18 and 19 may be performed after the application of conductive film 90 and the plurality of cuts 52a and/or 52b to create channels 50 of step 17. Notably the lead sidewalls 55 and 56 of the plurality of leads 23 (e.g., the surfaces facing channels 50) may be plated at step 18 of the process 100 of FIG. 1. As shown in FIG. 11 a second electrical plating 70 may be applied by an electroplating process, at step 18 of the process 100 of FIG. 1. The second electrical plating 70 may be one or more layers of a metal such as tin or a tin alloy that is plated on the lead sidewalls 55 and 56 and may protect the lead sidewalls 55 and 56 from oxidation and may also provide a wettable surface for soldering. The electroplating process at step 18 may include depositing a conductive plating material (not shown) to cover the exposed surface of lead sidewalls (e.g., through the channels 50). During the electroplating process of step 18, the semiconductor die package 80 of the package assembly 200, connected by the conductive film 90, may be dipped in a bath and may be electrically coupled to the cathode of an electrolytic plating device (not shown). The anode of the electrolytic plating device may be coupled to the plating material, which is also dipped in the bath. An electrical current may be applied to the lead frame 25 of the package assembly 200, connected by the conductive film 90, which causes the plating material to be deposited on the exposed surfaces of the lead sidewalls 55 and 56 of the plurality of leads so that, for example, the exposed surface of the lead sidewalls 55 and 56 leads 23 are plated with the plating material (i.e., resulting in electrical plating 70). At step 18, because only the surfaces of the lead sidewalls 55 and 56 are exposed, only these surfaces are plated by the second electrical plating 70. Notably, after applying the second electrical plating 70 at step 18, at least two surfaces of each portion 24*a* and 24*b* of a lead 23 (e.g., a first portion 24*a* and second portion 24*b* of lead 23*b*) are covered by electrical plating (e.g., first electrical plating 30 on a plating surface 27*b* (e.g., bottom surface) and second electrical plating 70 on a lead sidewalls 55, 56).

At step 19 of the process 100 of FIG. 1, the conductive film 90 is removed, as shown in FIG. 8. As shown, after removal of the conductive film 90 at step 19, only the plurality of semiconductor die packages 80, of package assembly 200 of FIG. 11, remain. Each of the plurality of semiconductor die packages 80 include a first portion 24*a* of a lead 23 (e.g., a second portion of lead 23*b* shown in the middle semiconductor die package 80 of FIG. 8), a die 20 (e.g., die 20*a*) bonded to a second portion 24*b* of the lead 23*a*, a wire 21 (e.g., wire 21*a*) electrically connecting the die 20 (e.g., die 20*a*) to the first portion 24*a* of a lead 23 (e.g., a first portion 24*a* of lead 23*b*). Additionally, each of the portions of leads 23 for each of the plurality of semiconductor die packages 80 include electrical plating material on the plating surfaces 27*b* (e.g., electrical plating material 30) of the portions of the leads 23 as well as the lead sidewalls 55 and 56 (e.g., electrical plating material 70) of each of the leads 23. The electrical plating material (e.g., 30 and/or 70) may serve to mount a given semiconductor die package to a printed circuit board (PCB).

Although a specific number and configuration of leads (e.g., leads 23*a* and 23*b*) is shown and/or described herein, the techniques of the present disclosure are applicable to assembly packages having any configuration of leads and/or dies. Additionally, it is understood by one in the art that the same or similar techniques may be applied to provide QFN packages with wettable flanks as DFN packages with wettable flanks.

Figure 12A:
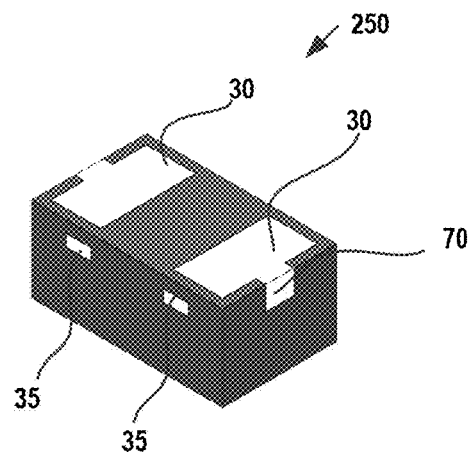
FIG. 12A is a perspective view of a bottom side of a DFN package with bottom and sidewall plating, according to an example.
Figure 12B:
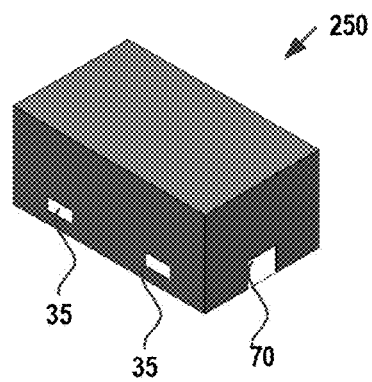
FIG. 12B is perspective view of a top side of the DFN package of FIG. 12A with bottom and sidewall plating, according to an example.

FIGS. 12A and 12B show a DFN package with wettable flanks 250 with a first electrical plating material 30 on the bottom of two corresponding leads (not shown) as well as a second electrical plating 70 on the lead sidewalls (not shown) of the DFN package 250. The first plating material 30 and the second plating material 70 may be plated in accordance with the process 100 of FIG. 1, as disclosed herein. Additionally, as shown in FIG. 12A a die bar area 35 may also be plated (e.g., with second electrical plating 70). The die bar area 35 may assist with, as disclosed herein, forming an electrical connection for current flow during electroplating (e.g., during the first electrical plating 30 and/or second electrical plating 70 such as, for example, in the absence of a conductive film 90).

Figure 12C:
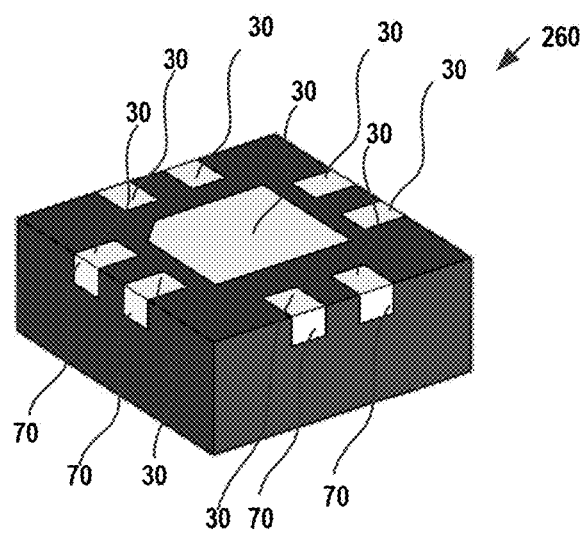
FIG. 12C is a perspective view of a bottom side of a QFN package with bottom and sidewall plating, according to an example.
Figure 12D:
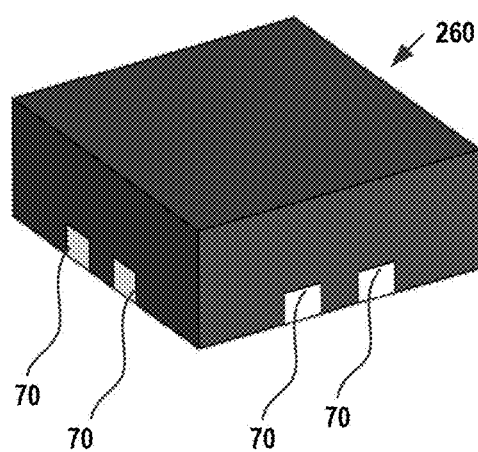
FIG. 12D is a perspective view of the top side of the QFN package of FIG. 12C with bottom and sidewall plating, according to an example.

FIGS. 12C and 12D show a QFN package 260 with a first electrical plating material 30 on the bottom of corresponding leads (not shown) as well as a second electrical plating 70 on the lead sidewalls (not shown) of the QFN package 260. The first plating material 30 and the second plating material 70 may be plated in accordance with the process 100 of FIG. 1, as disclosed herein.

The process 100 of FIG. 1, as described herein, provides a multi-step plating process to form semiconductor die package having wettable flanks. The process 100 provides for separate plating steps for plating different surfaces (e.g., plating surface or sidewalls) of semiconductor die packages. The separate plating steps may allow for a simplified plating process and may reduce the complexity of plating multiple surfaces at the same time. Further, the separate plating steps may allow for plating different surfaces (e.g., plating surface or sidewalls) with different plating material or different concentration of plating materials.

It will be appreciated that the foregoing is presented by way of illustration only and not by way of any limitation. It is contemplated that various alternatives and modifications may be made to the described embodiments without departing from the spirit and scope of the invention. Having thus described the present invention in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiment and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

What is claimed is:

1. A method for fabricating a semiconductor die package from a package assembly comprising:

providing a lead frame comprising at least a first lead and a second lead, the first and second leads each having a top surface and a bottom surface, a first integrated circuit die on the top surface of the first lead, and a second integrated circuit die on the top surface of the second lead;

encapsulating at least portions of the lead frame and at least portions of the first integrated circuit die and the second integrated circuit die in a mold encapsulation, the mold encapsulation having a top major surface and a bottom major surface;

plating the bottom surface of the first and second leads with a first electrical plating;

applying a connecting film to the top surface of the mold encapsulation;

cutting through the first electrical plating on the bottom surface of the second lead through the top major surface of the mold encapsulation to create a channel, the channel exposing a first lead sidewall and a second lead sidewall of the second lead;

applying a conductive film to connect the bottom surface of the first lead and the bottom surface of the second lead;

removing the connecting film;

plating, through the channel, the first lead sidewall and the second lead sidewall with a second electrical plating; and removing the conductive film.

2. The method of claim 1, wherein cutting further comprises making a partial cut through the connecting film.

3. The method of claim 1, wherein the first electrical plating and the second electrical plating comprise at least one of a tin material and a tin alloy material.

4. The method of claim 1, wherein the channel separates the second lead into two portions.

5. The method of claim 4, wherein the first integrated circuit die on the first lead is electrically connected to a first portion of the two portions of the second lead by a bonding wire.

6. The method of claim 5, wherein the second integrated circuit is on a second portion of the two portions of the second lead.

7. The method of claim 1, wherein plating the bottom surface of the first lead and the bottom surface of the second lead comprises:

dipping the package assembly in a solution;

electrically coupling a power source to the lead frame and to a plating material in the solution; and applying current to the lead frame via the power source.

8. A method for fabricating a semiconductor package from a package assembly comprising:

providing a lead frame comprising at least a first lead and a second lead, the first and second leads each having a top surface and a bottom surface, a first integrated circuit die on the top surface of the first lead, and a second integrated circuit die on the top surface of the second lead;

encapsulating at least portions of the lead frame and at least portions of the first integrated circuit die and the second integrated circuit die in a mold encapsulation, the mold encapsulation having a top major surface and a bottom major surface;

plating the bottom surface of the first lead and the bottom surface of the second lead with a first electrical plating;

applying a conductive film to connect the bottom surface of the first lead and the bottom surface of the second lead;

cutting through the mold encapsulation, the second lead, and the first electrical plating on the bottom surface of the second lead to create a channel, the channel exposing a first lead sidewall and a second lead sidewall of the second lead;

plating, through the channel, the first lead sidewall and the second lead sidewall with a second electrical plating; and removing the conductive film.

9. The method of claim 8, wherein making the cut further comprises making a partial cut through the conductive film.

10. The method of claim 8, wherein the channel separates the second lead into two portions.

11. The method of claim 10, wherein the first integrated circuit die on the first lead is electrically connected to a first portion of the two portions of the second lead by a bonding wire.

12. The method of claim 11, wherein the second integrated circuit is on a second portion of the two portions of the second lead.

13. The method of claim 8, wherein plating the bottom surface of the first lead and the bottom surface of the second lead comprises:

dipping the package assembly in a solution;

electrically coupling a power source to the lead frame and to a plating material in the solution; and applying current to the lead frame via the power source.

14. The method of claim 8, wherein cutting through the mold encapsulation, the second lead, and the first electrical plating on the bottom surface of the second lead to create the channel is performed while the conductive film is connected to the bottom surface of the first and second leads.

15. A method for fabricating lead side-wall wettable semiconductor die packages from a lead frame assembly comprising a plurality of leads, each lead comprising a die surface and a plating surface, and an integrated circuit die arranged on the die surface, the method comprising:

partially embedding the lead frame assembly in a mold encapsulation, the mold encapsulation having opposed first and second major surfaces;

plating the plating surface of each of the plurality of leads with a first electrical plating;

applying a first connecting film to the first major surface of the mold encapsulation;

singulating the lead frame assembly into individual semiconductor packages, the singulating comprising:

making a first series of parallel cuts along a first direction cutting through the second major surface of the mold encapsulation to a depth up to the first connecting film or a portion of the first connecting film;

making a second series of parallel cuts along a second direction, the second direction substantially perpendicular to the first direction, the second series of parallel cuts cutting through the second major surface of the mold encapsulation, each of the plurality of leads, and the electrical plating of each of the plurality of leads to a depth up to the first connecting film or a portion of the first connecting film to create a channel exposing a first lead sidewall and a second lead sidewall of each of the plurality of leads;

applying a second connecting film to connect the plating surface of each of the plurality of leads;

removing the first connecting film to separate the individual lead side-wall wettable semiconductor packages;

plating, through the channel, the first lead sidewall and the second lead sidewall of each of the plurality of leads with a second electrical plating.

16. The method of claim 15, wherein each circuit die is electrically connected to an adjacent lead by a bonding wire.

17. The method of claim 16, wherein plating the plating surface of each of the plurality of leads comprises:

providing a plating material solution on the plating surface of each of the plurality of leads; and electrically coupling a power source to the plurality of leads, and applying current to the plurality of leads via the power source.

18. The method of claim 15, wherein removing the first connecting film comprises removing the first connecting film before plating the first lead sidewall and the second lead sidewall of each of the plurality of leads with the second electrical plating, the method further comprising:
removing the second connecting film after plating the first lead sidewall and the second lead sidewall of each of the plurality of leads with the second electrical plating.

19. The method of claim 15, further comprising:
applying a film to the plating surface of each of the plurality of leads prior to embedding the lead frame assembly in the mold encapsulation; and
removing the film prior to plating the plating surface of each of the plurality of leads with the first electrical plating.

20. A lead side-wall wettable semiconductor package made by the method of claim 15.

* * * * *